United States Patent [19]
Fukunaka et al.

[11] Patent Number: 5,321,666
[45] Date of Patent: Jun. 14, 1994

[54] CONTROL CIRCUIT OF DYNAMIC RANDOM ACCESS MEMORY

[75] Inventors: Hidetada Fukunaka; Akira Ishiyama, both of Hadano, Japan

[73] Assignee: Hitachi, Ltd., Tokyo, Japan

[21] Appl. No.: 716,821

[22] Filed: Jun. 17, 1991

[30] Foreign Application Priority Data

Jun. 18, 1990 [JP] Japan ................................. 2-157501

[51] Int. Cl.[5] ............................................. G11C 7/00
[52] U.S. Cl. ........................... 365/230.08; 365/230.03; 365/233; 371/2.2
[58] Field of Search .............. 365/233, 230.01, 230.03, 365/230.08; 371/2.1, 2.2

[56] References Cited

U.S. PATENT DOCUMENTS

| | | | |
|---|---|---|---|
| 4,984,210 | 1/1991 | Kumanoya et al. | 365/233 |
| 5,036,493 | 6/1991 | Nielsen | 365/233 |
| 5,036,494 | 7/1991 | Wise et al. | 365/233 |
| 5,058,074 | 10/1991 | Sakamoto | 365/233 |
| 5,159,572 | 10/1992 | Morton | 365/233 |
| 5,175,707 | 12/1992 | Murotani | 365/233 |

FOREIGN PATENT DOCUMENTS 62-252591 4/1987 Japan .

Primary Examiner—John S. Heyman
Attorney, Agent, or Firm—Kenyon & Kenyon

[57] ABSTRACT

A control circuit of a memory system including a dynamic random access memory may include a first integrated circuit formed on a common substrate. The first integrated circuit may include a circuit responsive to an external memory access request signal for generating a control signal for controlling an operation timing of the dynamic random access memory to supply the control signal to the dynamic random access memory and a circuit for generating an address signal for specifying an address of the dynamic random access memory to be accessed to supply the address signal to the dynamic random access memory. A second integrated circuit includes a read/write circuit for reading data from the dynamic random access memory and for writing data in the dynamic random access memory.

22 Claims, 3 Drawing Sheets

CONTROL CIRCUIT OF DYNAMIC RANDOM ACCESS MEMORY

BACKGROUND OF THE INVENTION

The present invention relates to a control circuit of a memory system including a dynamic random access memory (hereinafter referred to as a DRAM) as a memory element, and more particularly to a circuit configuration of an integrated circuit suited for a case in which the control circuit of the DRAM is constituted of a plurality of integrated circuits.

Generally, in order to make access to a desired address of the DRAM, a memory address signal includes a row address signal and a column address signal. That is, an address is specified by the row address and the column address. A row address strobe (RAS) signal and a column address strobe (CAS) signal are generated by a control circuit with a predetermined time relation to the address signal. The row address strobe signal indicates a read-out timing of the row address signal and the column address strobe signal indicates a read-out timing of the column address signal. The control circuit also generates a write enable (WE) signal for indicating whether a memory access request signal supplied externally to the control circuit indicates the writing or reading operation.

Japanese Unexamined Patent Publication JP-A-62-252591 filed Apr. 24, 1986 by Seiko Electronic Industry Co., Ltd. discloses that RAS, CAS and WE signals of the control signals are generated by a timing controller and a memory address is generated by an LSI circuit different from an LSI circuit including the timing controller in response to an instruction of the timing controller.

Further, the DRAM is connected to a data bus through a bus gate for transmission and reception of data. When detection and correction of error in data are made, a circuit for the detection and correction of errors is additionally provided between the DRAM and the bus gate.

In the technique disclosed in the above publication, the timing controller and the address controller of the DRAM control circuit are constituted of different LSI chips, respectively. Thus, differences in a signal propagation time occur between the RAS signal and the CAS signal of the control signals in the timing controller circuit and the row address signal and the column address signal in the address control circuit due to scattered characteristics in the manufacture of the LSI chips. Accordingly, in order to absorb the variations of signal propagation time between the different LSI chips, it is necessary to add sufficient margins to the respective time relations between the RAS signal and the row address signal and between the CAS signal and the column address signal. This causes increased access time and cycle time of the memory by the added margin. At the same time, there is a problem that a rising of the RAS signal and the CAS signal is retarded due to delay of the control signal in a signal path between the LSI chip for the timing control and the LSI chip for the address control.

When a memory bank is increased, the number of components is greatly increased so that a reduction in reliability occurs.

In order to solve the above problems, one may consider incorporating all functions of the control circuit of the DRAM into a single LSI chip. However, this is not practical in view of the remarkably increased number of pins of the LSI chip and a cost thereof.

SUMMARY OF THE INVENTION

It is an object of the present invention to provide a control circuit of a DRAM in which a timing controller and an address controller are fabricated on a common LSI circuit so that an access time and a cycle time are reduced and the number of pins of an LSI circuit is properly distributed by a division of LSI circuits.

Further, it is another object of the present invention to provide a control circuit of a DRAM which is fabricated by LSI circuits to cope easily with expansion of a memory bank.

In order to achieve the above objects, according to the control circuit of the DRAM of the present invention, reception of a memory request signal and generation of control signals such as a row address strobe signal and a column address strobe signal and a memory address signal are performed by a first LSI circuit collectively, and transmission and reception of input and output data between the DRAM and a data bus are performed by a second LSI circuit.

Further, in order to minimize the skew, an output route for the control signal and the memory address signal requiring a severe time relation between each other is implemented by a combination of gates of the same type.

The first LSI circuit possesses a function of generating a plurality of sets of control signals and can control DRAM's constituting the respective memory banks so as to cope with expansion of the memory banks easily.

In the control circuit of the DRAM according to the present invention, since generation of the control signal such as the RAS and CAS signal and the memory address signal and reception of the memory request signal are made by the first LSI circuit collectively, a timing margin between the control signal and the address signal can be minimized and the delay of the signals between the LSI circuits can be removed so that the access time or the cycle time can be reduced.

The number of pins of the LSI circuits can be distributed to the first and second LSI circuits properly by utilizing the second LSI circuit as an LSI circuit for data. Thus, even when a width of data is increased, it can be prevented that the total number of pins of the LSI circuit is extremely increased.

Further, in the first LSI circuit, the output route of the control signals can be implemented by a combination of gates of the same type so that the skew between the control signals can be suppressed to a minimum and the access time or the cycle time can be made shorter.

The first LSI circuit has a function of generating a plurality of sets of control signals and the second LSI circuit is increased so that it makes possible to cope with expansion of the memory banks easily while maintaining the balance of the number of pins of the LSI circuits.

DESCRIPTION OF THE PREFERRED EMBODIMENTS

Embodiments of the present invention are now described with reference to the accompanying drawings.

Figure 1:
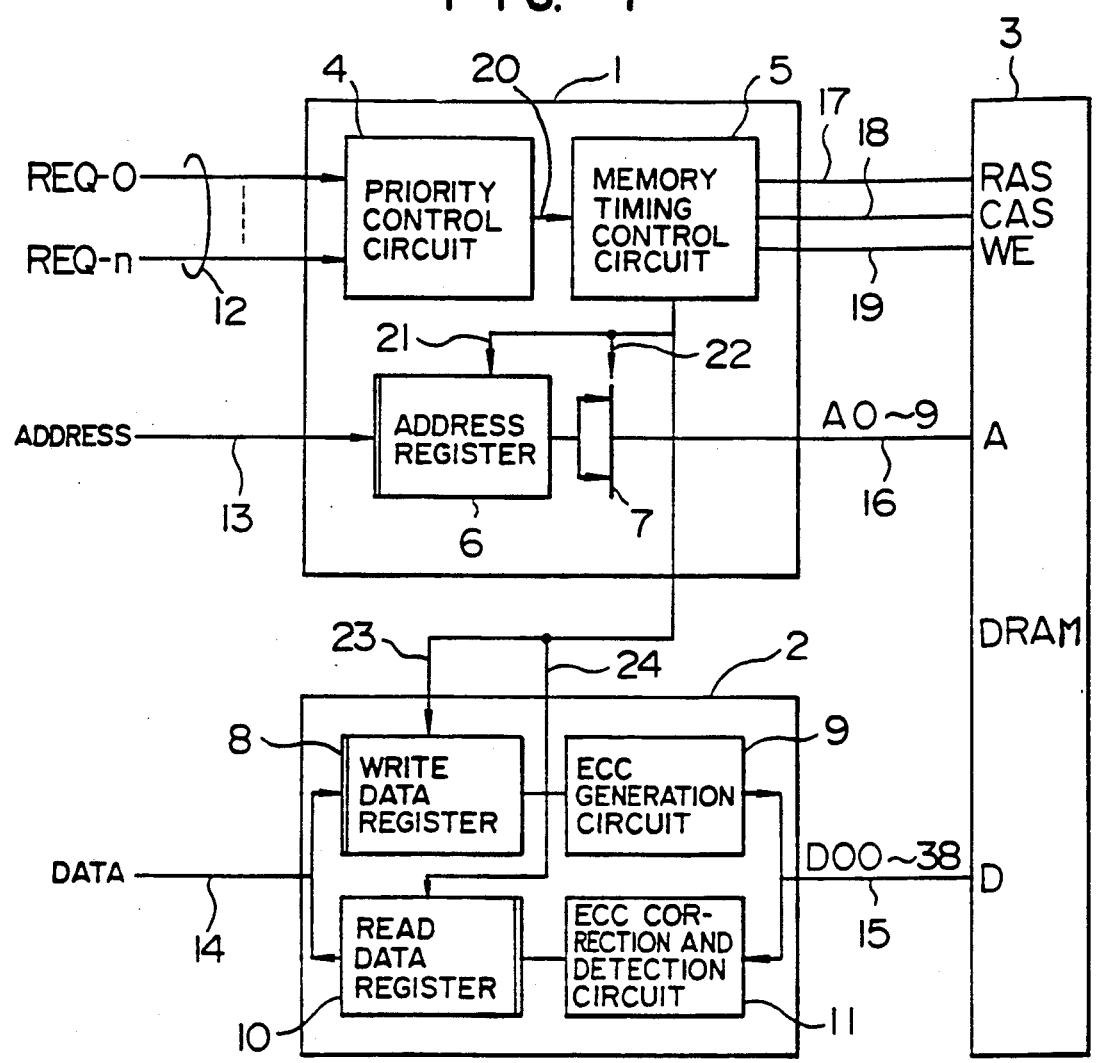
FIG. 1 is a block diagram showing an embodiment of the present invention.

FIG. 1 is a block diagram showing an embodiment of the present invention.

In FIG. 1, a control LSI circuit 1 comprises a priority control circuit 4 for receiving memory request signals, a memory timing control circuit 5 for generating various timing signals, an address register 6 for holding an address signal from a request source, and a selector circuit 7 for switching a row address and a column address supplied to a dynamic random access (DRAM) memory 3. Further, a data LSI circuit 2 comprises a write data register 8 for holding write data, an ECC generation circuit 9 for generating an error check code (ECC) for the write data, an ECC correction and detection circuit 11 for detecting and correcting an error in a read-out data, and a read data register 10 for temporarily holding the read-out data.

Operation of the LSI circuits is now described. The control LSI circuit 1 receives memory request signals 12 (REQ-0, ..., REQ-n) from external processing units, input/output units and the like (not shown) through the priority control circuit 4. When a plurality of request signals REQ-0-REQ-n are supplied to the priority control circuit 4 simultaneously, the priority control circuit 4 selects a request signal having the highest priority and returns a reception signal to the request source which has issued the request signal while a start signal 20 is supplied to the memory timing control circuit 5 simultaneously.

The memory timing control circuit 5 produces, in response to the start signal 20 from the priority control circuit 4, an RAS (row addresss strobe) signal 17, a CAS (column address strobe) signal 18 and a WE (write enable) signal 19 which are control signals for the DRAM 3, an address latch signal 21 and a row address selection signal 22 supplied to the address register 6 and the selector circuit 7, respectively, in the control LSI circuit 1 and a write data latch signal 23 and a read data latch signal 24 supplied to the write data register 8 and the read data register 10, respectively, in the data LSI circuit 2.

A request address signal 13 supplied from the request source is held in the address register 6 in response to the address latch signal 21 from the memory timing control circuit 5. The request address signal held in the address register 6 is supplied to the selector circuit 7 so that a row address signal and a column address signal are selected from the request address signal in the selector circuit 7 and are supplied to the memory 3 as a memory address signal 16. Switching of the row address signal and the column address signal is made in response to the row address selection signal 22 from the memory timing control circuit 5. The foregoing operation is a common procedure to the reading and the writing operation of data.

On the other hand, the data LSI circuit 2 receives a write data signal 14 from the request source in the write data register 8 in response to the write data latch signal 23 from the control LSI circuit 1 in the case where the data is written into the memory. The error check code (ECC) generation circuit 9 generates an ECC for the write data and the circuit 9 supplies the write data with the ECC added as a memory data signal 15 to the DRAM 3. Further, in the case where data is read out of the memory, a memory data signal 15 read out of the DRAM 3 is subjected to the error detection and correction in the ECC correction and detection circuit 11. The read data is held in the read data register 10 in response to the read data latch signal 24 from the control LSI circuit 1 and is returned as the read data signal 14 to the request source. The ECC generation circuit 9 and the ECC correction and detection circuit 11 can utilize a known circuit configuration.

Figure 2:
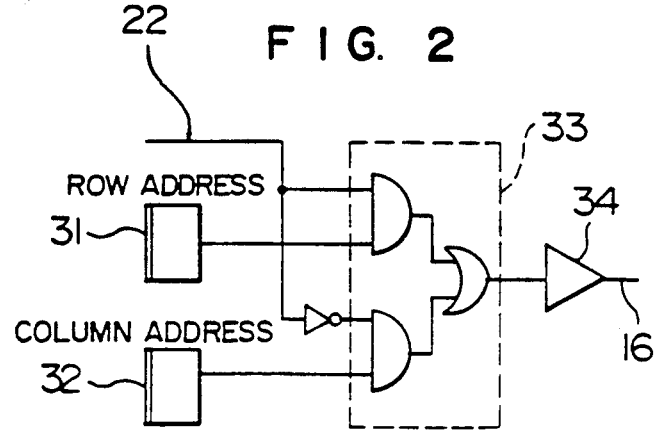
FIG. 2 is a circuit diagram showing an output route circuit for a memory address signal.

FIG. 2 is a circuit diagram of an output route in the LSI circuit 1. FIG. 2 shows a circuit of an output route for the memory address signal 16 and FIG. 3 shows a circuit of an output route for the RAS signal.

In FIG. 2, flip-flops 31 and 32 generate the row address signal and the column address signal, respectively. An AND/OR gate 33 selects one of the row and column address signals in response to a row address selection signal 22 and is produced through a buffer 34 as the memory address signal 16. Further, in FIG. 3, a flip-flop 35 generates the RAS signal, which is produced through an AND/OR gate 36 and a buffer 37 as the RAS signal 17.

Figure 3:
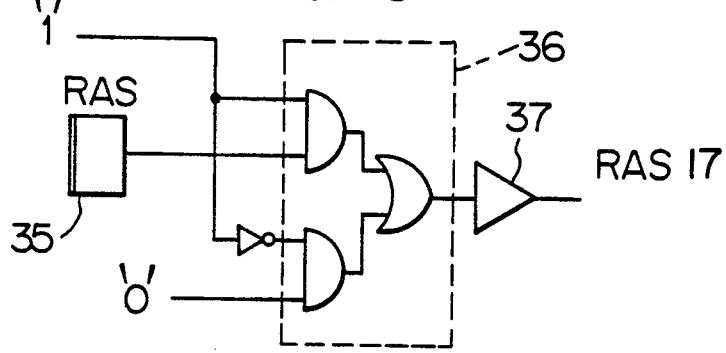
FIG. 3 is a circuit diagram showing an output route circuit for a RAS signal.

In the output circuit shown in FIGS. 2 and 3, it is assumed that the delay time of the propagation of signals in the gate can be neglected and when the delay times of the AND/OR gate 33 and the buffer 34 are $t_a$ and $t_b$, respectively, the delay time of the row address signal until it is produced as the memory address signal 16 after being selected by the row address selection signal is equal to a sum of the delay times $t_a$ and $t_b$, that is, $t_a + t_b$. Further, when the delay times of the AND-/OR gate 36 and the buffer 37 are $t_c$ and $t_d$, respectively, the delay time of the RAS signal until being produced from the buffer 37 after it is set in the flip-flop 35 is equal to a sum of the delay times $t_c$ and $t_d$, that is, $t_c + t_d$. If the AND/OR gates 33 and 36 and the buffers 34 and 37 are constituted of gates of the same type, the delay times $t_a$ and $t_b$ are equal to the delay times $t_c$ and $t_d$, respectively, that is, $t_a = t_c$ and $t_b = t_d$ so that the delay time of the row address signal until it is produced from the buffer 34 after being selected by the row address selection signal is equal to the delay time of the RAS signal until it is produced from the buffer 37 after being set in the flip-flop 35. Since a lower AND gate of the AND/OR gate 36 in FIG. 3 is a dummy gate and is always supplied at its one input with "0" level signal, the lower AND gate is not essential. However, the lower AND gate is provided purposely in order for the delay time of the AND/OR gate 36 to be equal to that of the AND/OR gate 33.

A severe time relation is required between the row address signal and the RAS signal. To meet this time relation requirement, when the gate circuits shown in FIGS. 2 and 3 are constituted of gates 33 and 36 of a same type, a timing between both of the signals can be set without considering a difference between the delay times, since there is no difference in the delay times of the gates.

As described above, the delay time of signals required for generation of the control signals for controlling the DRAM such as the start signal 20, the address latch signal 21, the row address selection signal 24 and the like can be only the propagation delay time in the LSI circuit by incorporating the priority control circuit 4, the memory timing control circuit 5, the address register 6 and the selector circuit 7 into the same LSI circuit. Accordingly, the delay time of the signals propagated between the LSI circuits can be removed so that reduction of the access time and reception of the request signal in a short cycle pitch can be attained.

Further, the output routes for the control signals such as the row address signal and the RAS signal and the column address signal and the CAS signal which require a severe time relation can be constituted of gates of the same type, so that the timing between the control signals can be set without considering the delay time of the signals in the gates to thereby reduce the access time.

Figure 4:
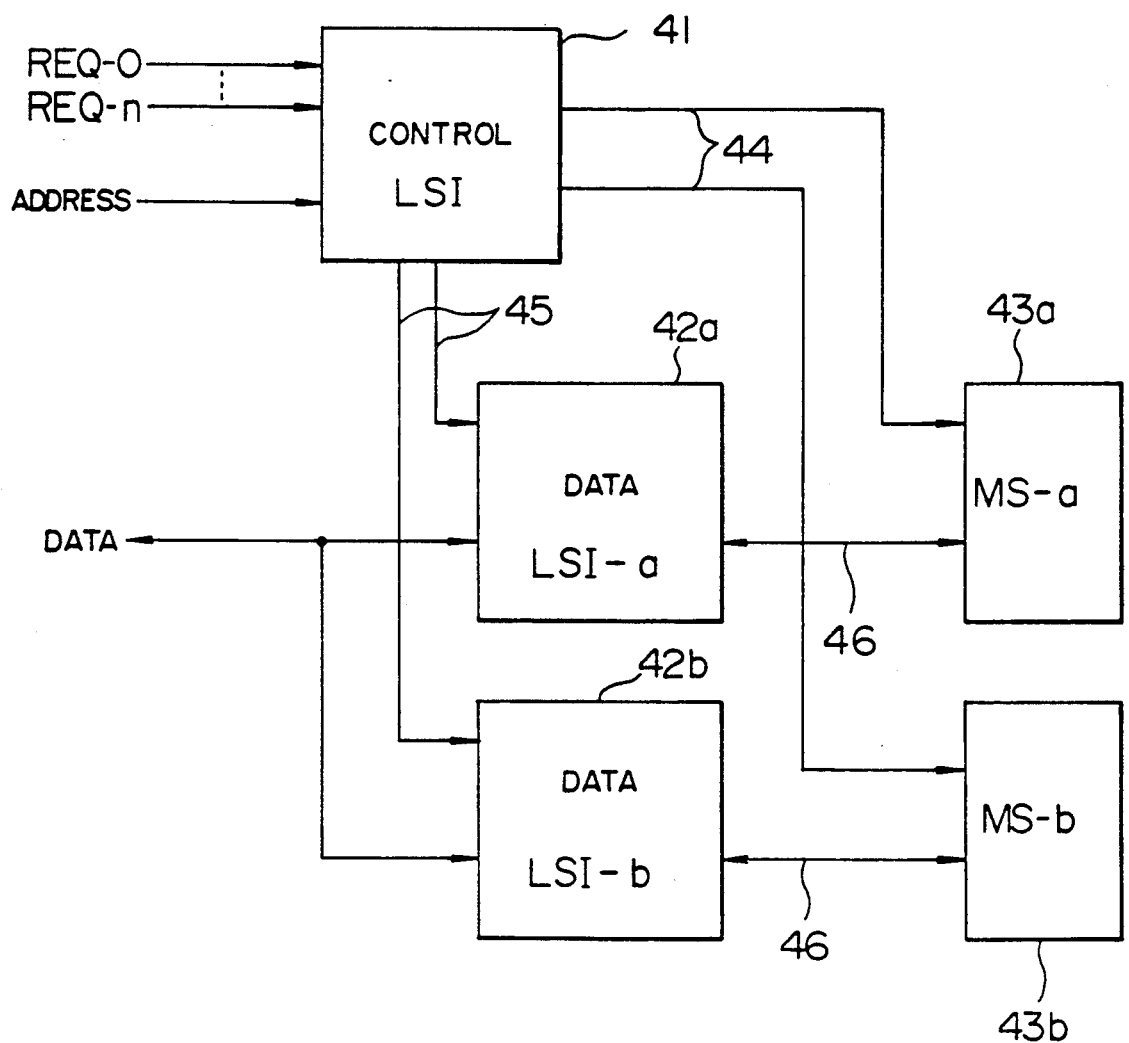
FIG. 4 is a block diagram showing a memory system configured by expanding the data LSI circuits and including two memory banks.
Figure 5:
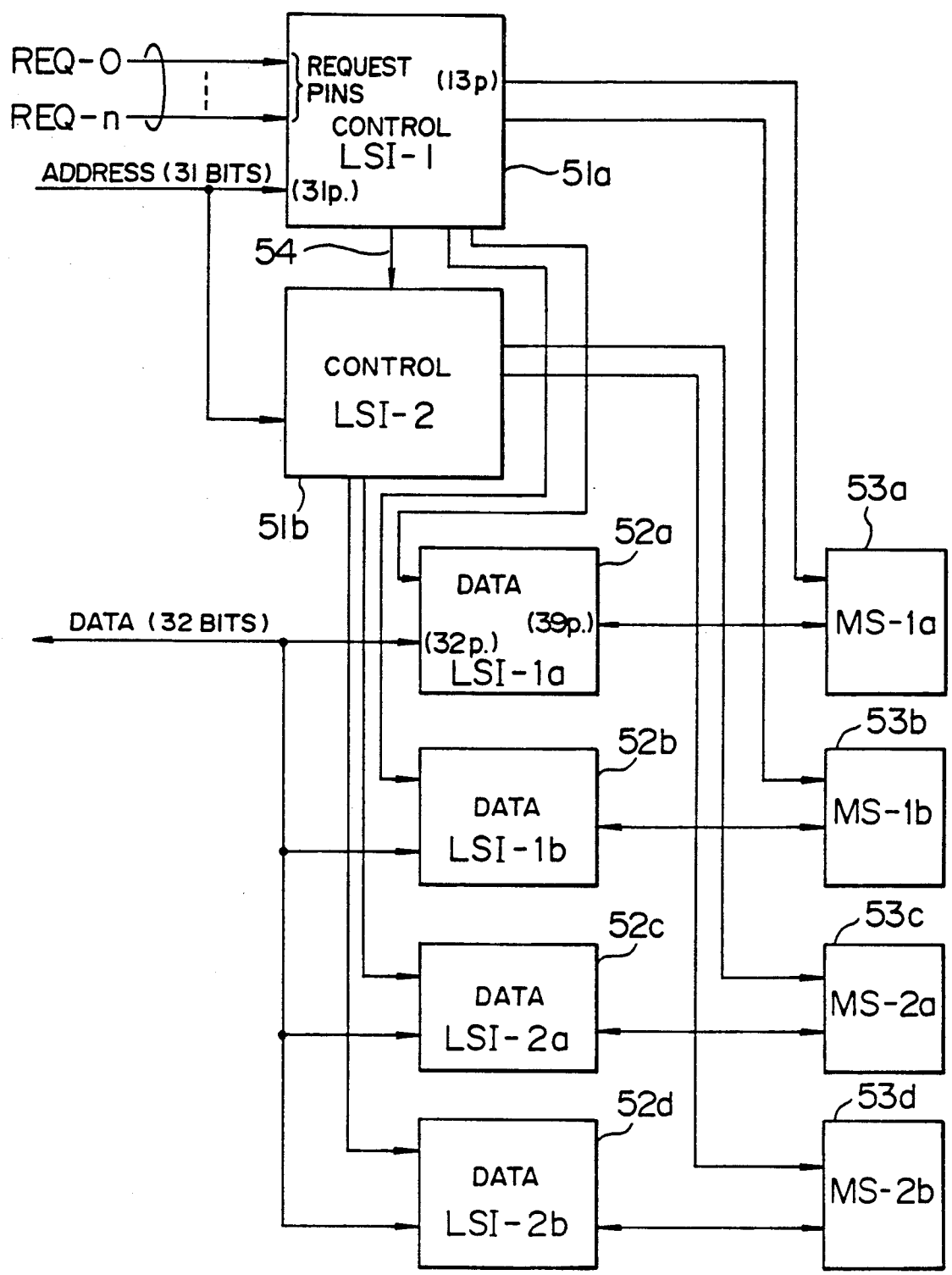
FIG. 5 is a block diagram showing a memory system configured by expanding the control LSI circuits and the data LSI circuits and including four memory banks.

Referring now to FIGS. 4 and 5, expansion of the memory system according to the present invention is described.

In order to increase a memory capacity and the throughput of the memory system, when the number of memory banks is increased, the memory system can be configured as shown in FIG. 4, for example.

In FIG. 4, a control LSI circuit 41 generates control signals 44 required for the memory control and control signals 45 required for control of the data LSI circuits 42a and 42b.

With the control signals 44 and 45, since an increase of signal lines due to an increase of the number of banks is relatively small, it is easy to generate control signals of two kinds by the single control LSI circuit. On the other hand, the number of signal lines for data is many and the number of pins of the LSI circuit must be greatly increased in order to control data of two kinds by the single data LSI circuit. Accordingly, since it is difficult to constitute the data LSI circuit by a mass-produced gate array, the single data LSI circuit controls data for a single memory bank. In FIG. 4, the data LSI circuit 42a controls the memory bank 43a and the data LSI circuit 42b controls the memory bank 43b.

FIG. 5 shows a further expansion of the memory system shown in FIG. 4.

In FIG. 5, a control LSI circuit 51a controls data LSI circuits 52a and 52b and memory banks 53a and 53b, and a control LSI circuit 51b controls data LSI circuits 52c and 52d and memory banks 53c and 53d, so that a memory system including four memory banks is configured. Further, in the memory system of FIG. 5, the request signals from the request source are received by the control LSI circuit 51a collectively and a start signal 54 which is a trigger signal for generation of the control signals is transmitted to the control LSI circuit 51b.

In the embodiment illustrated in FIG. 5, each of the control LSI circuits 51a and 51b possesses the function of controlling two memory banks and each of the data LSI circuits 52a, 52b, 52c and 52d possesses the function of processing data for one memory bank. Accordingly, for example, if a width of data is 32 bits and a width of address on the side of the request is 31 bits, each of the control LSI circuit 51a and 51b requires 31 pins for interfacing with an address bus and 13 pins in total of 10 pins for a memory address and 3 pins one for each of the RAS, CAS and WE signals for one memory bank when the control LSI circuit interfaces with a DRAM having the memory capacity of one megabits, and the control LSI circuit can be incorporated into an LSI circuit having about 100 pins even if other pins such as a request pin and the like are included. Further, each of the data LSI circuits 52a to 52d requires 32 pins for interfacing with a data bus and 39 pins for interfacing with the DRAM (32 bits for data plus 7 bits for ECC) and can be incorporated into an LSI circuit having about 100 pins in total in the same manner as the control LSI circuit.

In this manner, by constituting the control circuit of the DRAM by the LSI circuits divided into the control and data LSI circuits, the number of pins of the LSI circuits can be distributed to both of the LSI circuits with balance, so that a memory system having good expandability can be attained.

In the embodiment, the foregoing description has been made to the case where the control LSI circuit possesses the function of controlling two memory banks and the data LSI circuit possesses the function of processing data for one memory bank. However, the present invention is not limited thereto and the number of memory banks capable of being handled by each of the LSI circuits may be changed within the range of the number of gates or pins of the LSI circuit.

According to the present invention, since the skew due to a difference of the delay time between the control signals for the DRAM can be made small, a high performance memory system having a reduced cycle time may be provided.

Further, the number of pins for the LSI circuits can be distributed properly by the division of the LSI circuit to the control and data LSI circuits and a low-cost DRAM control LSI circuit can be provided which is capable of utilizing a mass-produced gate array.

A combination of a plurality of control and data LSI circuits can increase the memory banks easily and a memory system having a high expandability can be provided.

What is claimed is:

1. A control circuit of a memory system including a dynamic random access memory, said control circuit comprising:
 a first integrated circuit formed on a common substrate and including:
  a control signal generator responsive to an external memory access request signal and generating a control signal for controlling an operation timing of the dynamic random access memory; and
  an address signal generator generating an address signal specifying an address of the dynamic random access memory to be accessed and supplying the address signal to the dynamic random access memory; and
 a second integrated circuit including a data read/write device reading data from the dynamic random access memory and writing data in the dynamic random access memory.

2. A control circuit according to claim 1, said first integrated circuit further comprising:
 a first output circuit supplying the control signal generated by said control signal generator to the dynamic random access memory; and
 a second output circuit supplying the address signal generated by the address signal generator to the dynamic random access memory;
 wherein the first output circuit and the second output circuit are each formed of a common type gate circuit and are disposed on the common substrate of the first integrated circuit.

3. A control circuit according to claim 1, wherein the dynamic random access memory comprises a plurality of memory banks and said first integrated circuit supplies the control signal generated by said control signal generator to each of said plurality of memory banks.

4. A control circuit according to claim 3, wherein said second integrated circuit is provided for each of said memory banks.

5. A control circuit of a memory system including a dynamic random access memory, said control circuit comprising:
- a first integrated circuit formed on a common substrate and including:
  - a control signal generator responsive to an external memory access request signal and generating a control signal for controlling an operation timing of the dynamic random access memory; and
  - an address signal generator generating an address signal specifying an address of the dynamic random access memory to be accessed and supplying the address signal to the dynamic random access memory; and
- a second integrated circuit including:
  - a data read/write device reading data from the dynamic random access memory and writing data in the dynamic random access memory; and
  - an adder adding an error check code to data to be written in the dynamic random access memory to detect and correct errors on the basis of the error check code in data read from the dynamic random access memory.

6. A control circuit according to claim 5, wherein the address signal generated by the address signal generator includes a row address signal and a column address signal, and wherein the control signal generated by the control signal generator includes a row address strobe signal indicating a reading timing of the row address signal, a column address strobe signal indicating a reading timing of the column address signal, and a write enable signal indicating whether the memory access request signal is a writing request or a reading request.

7. A control circuit according to claim 6, said first integrated circuit further comprising:
- a first output circuit supplying the control signal generated by said control signal generator to the dynamic random access memory; and
- a second output circuit supplying the address signal generated by the address signal generator to the dynamic random access memory;
- wherein the first output circuit and the second output circuit are each formed of a common type gate circuit and are disposed on the common substrate of the first integrated circuit.

8. A control circuit according to claim 7, wherein the dynamic random access memory comprises a plurality of memory banks and said first integrated circuit supplies the control signal generated by said control signal generator to each of said plurality of memory banks.

9. A control circuit according to claim 8, wherein said second integrated circuit is provided for each of said memory banks.

10. A control circuit according to claim 5, said first integrated circuit further comprising:
- a first output circuit supplying the control signal generated by said control signal generator to the dynamic random access memory; and
- a second output circuit supplying the address signal generated by the address signal generator to the dynamic random access memory;
- wherein the first output circuit and the second output circuit are each formed of a common type gate circuit and are disposed on the common substrate of the first integrated circuit.

11. A control circuit according to claim 5, wherein the dynamic random access memory comprises a plurality of memory banks and said first integrated circuit supplies the control signal generated by said control signal generator to each of said plurality of memory banks.

12. A control circuit according to claim 11, wherein said second integrated circuit is provided for each of said memory banks.

13. A control circuit of a memory system including a dynamic random access memory, said control circuit comprising:
- a first integrated circuit formed on a common substrate and including:
  - a control signal generator responsive to an external memory access request signal and generating a control signal for controlling an operation timing of the dynamic random access memory; and
  - an address signal generator generating an address signal specifying an address of the dynamic random access memory to be accessed and supplying the address signal to the dynamic random access memory; and
- a second integrated circuit including a data read/write device reading data from the dynamic random access memory and writing data in the dynamic random access memory;
- wherein the address signal generated by the address signal generator includes a row address signal and a column address signal, and wherein the control signal generated by the control signal generator includes a row address strobe signal indicating a reading timing of the row address signal, a column address strobe signal indicating a reading timing of the column address signal, and a write enable signal indicating whether the memory access request signal is a writing request or a reading request.

14. A control circuit according to claim 13, said first integrated circuit further comprising:
- a first output circuit supplying the control signal generated by said control signal generator to the dynamic random access memory; and
- a second output circuit supplying the address signal generated by the address signal generator to the dynamic random access memory;
- wherein the first output circuit and the second output circuit are each formed of a common type gate circuit and are disposed on the common substrate of the first integrated circuit.

15. A control circuit according to claim 13, wherein the dynamic random access memory comprises a plurality of memory banks and said first integrated circuit supplies the control signal generated by said control signal generator to each of said plurality of memory banks.

16. A control circuit according to claim 15, wherein said second integrated circuit is provided for each of said memory banks.

17. A control circuit of a memory system including a dynamic random access memory, comprising:
- a first integrated circuit responsive to an external memory access request signal and performing control of an operation timing and designation of an address of the dynamic random access memory; and a second integrated circuit independent of said first integrated circuit and including a read/write circuit reading data from the dynamic random access memory and writing data in the dynamic random access memory;

said second integrated circuit further comprising an adder adding an error check code to data to be written in the dynamic random access memory to detect and correct errors on the basis of the error check code in data read from the dynamic random access memory.

18. A control circuit according to claim 17, said first integrated circuit formed on a common substrate and including:

a control signal generator responsive to the external memory access request signal and generating a control signal for controlling an operation timing of the dynamic random access memory; and an address signal generator responsive to an address signal specifying an address of the dynamic random access memory to be accessed and supplying the address signal to the dynamic random access memory.

19. A control circuit according to claim 18, wherein the address signal generated by the address signal generator includes a row address signal and a column address signal, and wherein the control signal generated by the control signal generator includes a row address strobe signal indicating a reading timing of the row address signal, a column address strobe signal indicating a reading timing of the column address signal, and a write enable signal indicating whether the memory access request signal is a writing request or a reading request.

20. A control circuit according to claim 18, said first integrated circuit further comprising:

a first output circuit supplying the control signal generated by said control signal generator to the dynamic random access memory; and a second output circuit supplying the address signal generated by the address signal generator to the dynamic random access memory;

wherein the first output circuit and the second output circuit are each formed of a common type gate circuit and are disposed on the common substrate of the first integrated circuit.

21. A control circuit according to claim 18, wherein the dynamic random access memory comprises a plurality of memory banks and said first integrated circuit supplies the control signal generated by said control signal generator to each of said plurality of memory banks.

22. A control circuit according to claim 21, wherein said second integrated circuit is provided for each of said memory banks.

* * * * *

UNITED STATES PATENT AND TRADEMARK OFFICE
CERTIFICATE OF CORRECTION

PATENT NO. : 5,321,666
DATED : June 14, 1994
INVENTOR(S) : Hidetada Fukunaka et al It is certified that error appears in the above-indentified patent and that said Letters Patent is hereby corrected as shown below:

Column 1, line 38, "error" should read --errors--.
Column 3, line 20, "DRAM memory" should read --memory (DRAM)--.

Signed and Sealed this

Twenty-fifth Day of October, 1994

Attest:

BRUCE LEHMAN

*Attesting Officer*    *Commissioner of Patents and Trademarks*